US005935410A

United States Patent [19]
Thönissen et al.

[11] Patent Number: 5,935,410
[45] Date of Patent: Aug. 10, 1999

[54] PROCESS AND DEVICE FOR THE LIGHTING-SUPPORTED STRUCTURING OF POROUS SILICON

[75] Inventors: Markus Thönissen, Nettetal; Michael Krüger; Hans Lüth, both of Aachen; Michael Götz Berger, Wachtberg-Pech; Wolfgang Theiss, Aachen, all of Germany; Gilles Lerondel, Doudeville; Robert Romestain, St. Mardin d'Heres, both of France

[73] Assignee: Forschungszentrum Jülich GmbH, Jülich, Germany

[21] Appl. No.: 08/933,540

[22] Filed: Sep. 19, 1997

[30] Foreign Application Priority Data

Sep. 21, 1996 [DE] Germany .......................... 196 38 881

[51] Int. Cl.$^{6}$ ................................ C25F 3/12; C25F 7/00

[52] U.S. Cl. ......................... 205/655; 205/656; 205/665; 204/224 M

[58] Field of Search .................................. 205/655, 656, 205/665; 204/224 M

[56] References Cited

U.S. PATENT DOCUMENTS

| | | | |
|---|---|---|---|
| 4,532,700 | 8/1985 | Kinney et al. | 205/656 X |
| 5,336,379 | 8/1994 | Chung et al. | 204/224 M X |
| 5,338,415 | 8/1994 | Sailor et al. | 205/655 X |
| 5,338,416 | 8/1994 | Mlcak et al. | 205/655 X |
| 5,458,735 | 10/1995 | Richter et al. | 205/655 X |
| 5,501,787 | 3/1996 | Bassous et al. | 205/656 X |

OTHER PUBLICATIONS

H. Föoll, "Properties of Silicon–Electrolyte Junctions and Their Application to Silicon Characterization", Appl. Phys. A 53, pp. 8–19 (1991) (No Month).

R.L. Smith and S.D. Collins, "Porous silicon formation mechanisms", J. Appl. Phys., vol. 71, No. 8, pp. R1–R19, Apr. 15, 1992.

Eric J. Lee et al., "Photoinduced surface reactions of reverse–biased n–type porous Si" J. Vac. Sci. Technol. B, vol. 14, No. 4, pp. 2850–2854, Jul./Aug. 1996.

*Primary Examiner*—Donald R. Valentine
*Attorney, Agent, or Firm*—Collard & Roe, P.C.

[57] ABSTRACT

A process for producing a structured area of porous silicon on a substrate, in which silicon is etched and structured by means of illumination, includes selectively aiming the illumination during or after the formation of the porous silicon directly at a selected area of a p-doped substrate in order to effect etching and structuring of the porous silicon in another area. A device for carrying out the process includes an illuminating system for supporting the etching process and for structuring the porous silicon, in which the illuminating system is selectively aimed during or after the formation of the porous silicon directly at a selected area of p-doped substrate in order to effect etching and structuring of the porous silicon in another area.

16 Claims, 2 Drawing Sheets

COMPUTER
10
16
13
5
18
24
LIGHT SOURCE
( LASER )
20
UNETCHED AREA
7
3
3
22
POROUS SILICON
1
P-SUBSTRATE
14

5
ILLUMINATED AREA
3
3
7
PS
PS
PS =
POROUS SILICON
PHOTO-
CURRENT
P-SUBSTRATE
1
24
ETCHING CURRENT
ETCHING CURRENT
22
ETCHING CURRENT
GENERATOR MEANS

PROCESS AND DEVICE FOR THE LIGHTING-SUPPORTED STRUCTURING OF POROUS SILICON

BACKGROUND OF THE INVENTION

1. Field of the Invention

The present invention relates to a process for producing a structured area of porous silicon on a substrate, in which silicon is etched and structured by the use of light, as well as to a device for producing a structured area of porous silicon on a substrate.

2. The Prior Art

Porous silicon (PS) has a suitable utility in highly developed silicon microelectronics and is readily manufactured at a favorable cost. Thus, PS is a promising material for applications in the field of sensors. Furthermore, due to its electro-luminescence, it is highly suitable for applications in the field of display technology as well. Display technology is very important in that display and control can be integrated on a chip. Porous silicon has applicability both as an actively luminescent material (e.g. for pixels in flat video screens) and also as a passive material (e.g. for application as a filter in color detectors). Thus, simple structuring of PS at favorable cost is of great importance.

A manufacturing process and apparatus are known from the state of the prior art, as well as also a component that can be manufactured by such a process. Until now, the structured areas consisting of porous silicon were produced by means of normal photolithography, using commercially available photolacquer or, for example, silicon nitride. Porous silicon is produced by an electrochemical etching process with the application of a mixture of hydroflouric acid and ethanol. Illumination of the layers leads to an illumination-dependent additional generation of pairs of electron holes both in the substrate and in the already etched porous silicon. The result is that the holes are used for the chemical reaction required for the etching process.

This has the drawback that a number of successive process steps are required. Another drawback is that the photo lacquer or nitride layer has to be stable versus the electrolyte used for the electrochemical manufacture of porous silicon.

SUMMARY OF THE INVENTION

It is an object of the present invention to provide a process for producing a structured area of porous silicon on a substrate. This process can without the application of photolithography result in a very simple manufacturing procedure. This procedure, as compared to the very costly steps of photolithography, can be implemented at a favorable cost. The invention process is based upon using a device for carrying out such a process.

The above object is achieved according to the present invention, in that during the formation of the PS or after the formation of the porous silicon, the lighting source is selectively directly aimed at a selected area of a p-doped substrate in order to form and to structure the porous silicon in another area devoid of illumination.

In the process according to the invention, instead of the application of photolithography, the desired structures of porous silicon are selectively directly etched and structured by the use of light applied to the specimen during the course of the manufacturing procedure.

It is another embodiment of the invention that a photocurrent is generated by illumination, such photocurrent flowing off from the selected, illuminated area and etching a non-selected, unilluminated area. Also, the photocurrent generated can be lower than an etching current.

It is a further embodiment of the invention that an etching current can be applied for an electrochemical etching process, with such etching current being compensated by the photocurrent. Also, the photocurrent generated can be higher than the etching current.

It is another embodiment of the invention that the illumination can be selectively switched on or off in order to influence a microstructure of the porous silicon. Also, the microstructure can be influenced with respect to its porosity and/or layer thickness. In addition, the illumination can be changed periodically. Also, the illumination can gradually be changed laterally.

The present invention is also directed to a device for producing a structured area of porous silicon on a substrate, comprising an illuminating system for supporting an etching process and for structuring the porous silicon; means whereby during or after the formation of the porous silicon, for selectively aiming the lumination system directly at a selected area of a p-doped substrate in order to effect etching and structuring of porous silicon in another area devoid of illumination.

It is another embodiment of the invention that the illuminating system generates a photocurrent, and this photocurrent flows off from the selected area and causes structuring of a non-selected, unilluminated area. Also, the photocurrent can be lower than the etching current. In addition, the photocurrent compensates an etching current applied to the substrate. Moreover, the photocurrent can be higher than the etching current.

It is a further embodiment of the invention that in the illuminating system there is a means which can selectively switch the system on or off in order to influence a microstructure of the area consisting of porous silicon. Therefore, the illuminating system influences the microstructure with respect to its porosity and/or layer thickness.

It is another embodiment of the invention that there is a means for changing the intensity of the illuminating system periodically. Also, there is a means for gradually changing the intensity of the illuminating system laterally.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views.

DETAILED DESCRIPTION OF PREFERRED EMBODIMENTS

A distinction has to be made between the use of n-doped substrates or p-doped substrates on which the porous layers have to be produced later in a structured form. Bending of the strip in the electrolyte-Si interface of the substrate occurs in varying degrees depending on the doping.

In the case of n-silicon, illuminating the specimens causes a photocurrent which, from its sign, has the same direction as the current applied externally for anodic etching of the porous layer.

However, the reverse situation occurs with p-silicon. Even though additional generation of pairs of electron holes occurs also in this case due to illumination of the specimen, the consequences of such illumination are different. Due to the bending of the strip in the p-doped material, the photocurrent is directed opposite to the current applied externally for the etching. This means that with suitable selection of the parameters, the etching current can be compensated by the photocurrent, and thus, by such illumination. Another effect of the illumination is the additional generation of pairs of electron holes in the areas of the porous structure. These areas would otherwise, already be deficient in charge carriers, so that further reduction of the sponge-like structure occurs. Therefore, a higher porosity of the microstructure is obtained.

Figure 1:
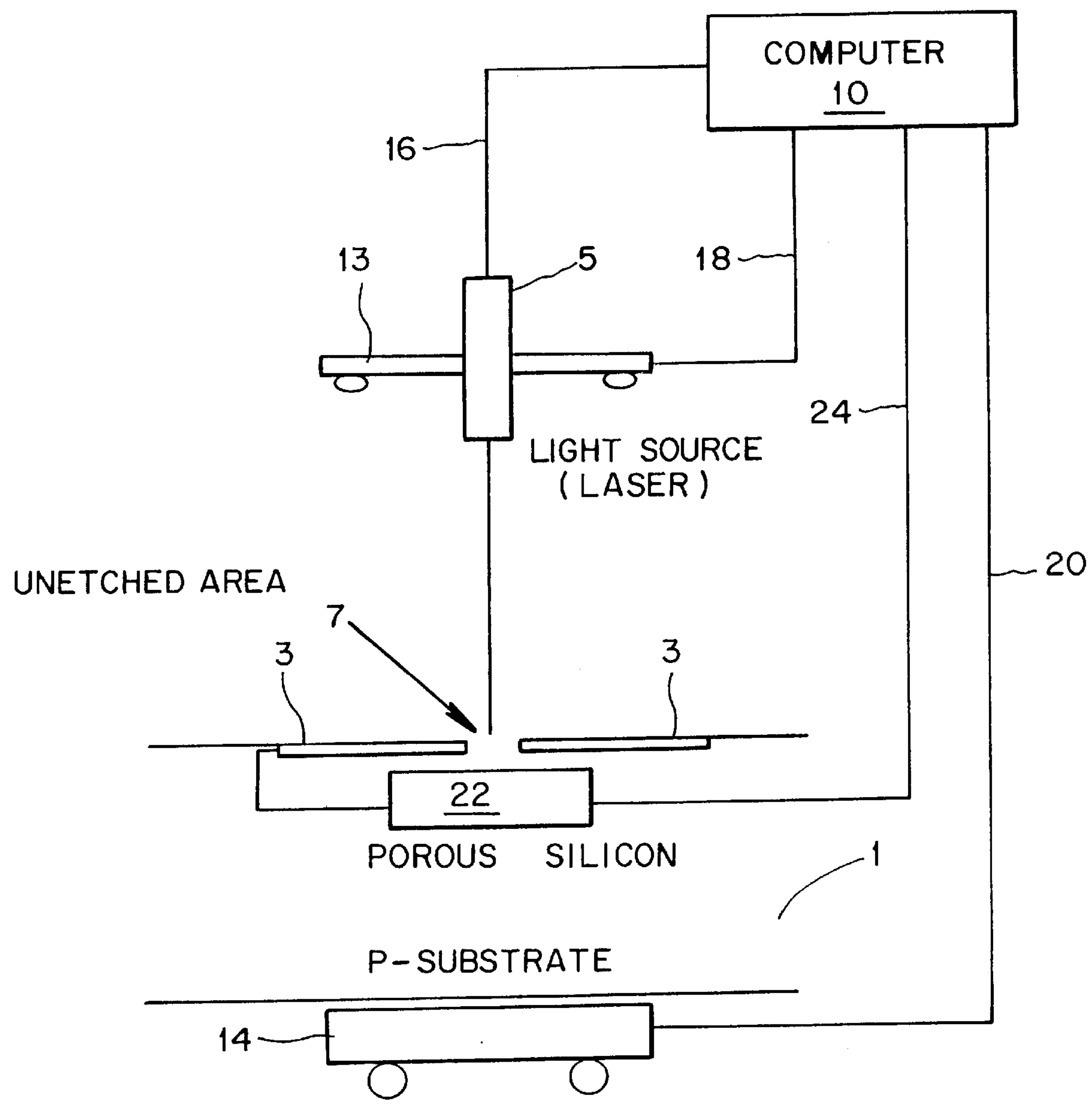
FIG. 1 shows a schematic view of the lighting system relative to a p-substrate of the invention.

Turning now in detail to the drawings, FIG. 1 shows schematically the arrangement of a p-doped substrate (1), on which a structured area (3) comprising of porous silicon is formed. An illuminating system (5) serving as the light source is arranged above the p-doped substrate (1). The illuminating system (5) may be, for example, a laser, which is aimed at a selected area (7) that is not to be etched.

The illuminating system is controlled by a control means, such as a computer 10. Relative movement between the light source 5 and the substrate 1 is caused by instructions from means 10 to either the motorized conveyor means 12 for moving the laser or to the motorized conveyor means 14 for moving the substrate. Instructions from computer 10 are carried over lead 16 to the laser 5, are carried over lead 18 to means 12, and are carried over lead 20 to the means 14.

Figure 2:
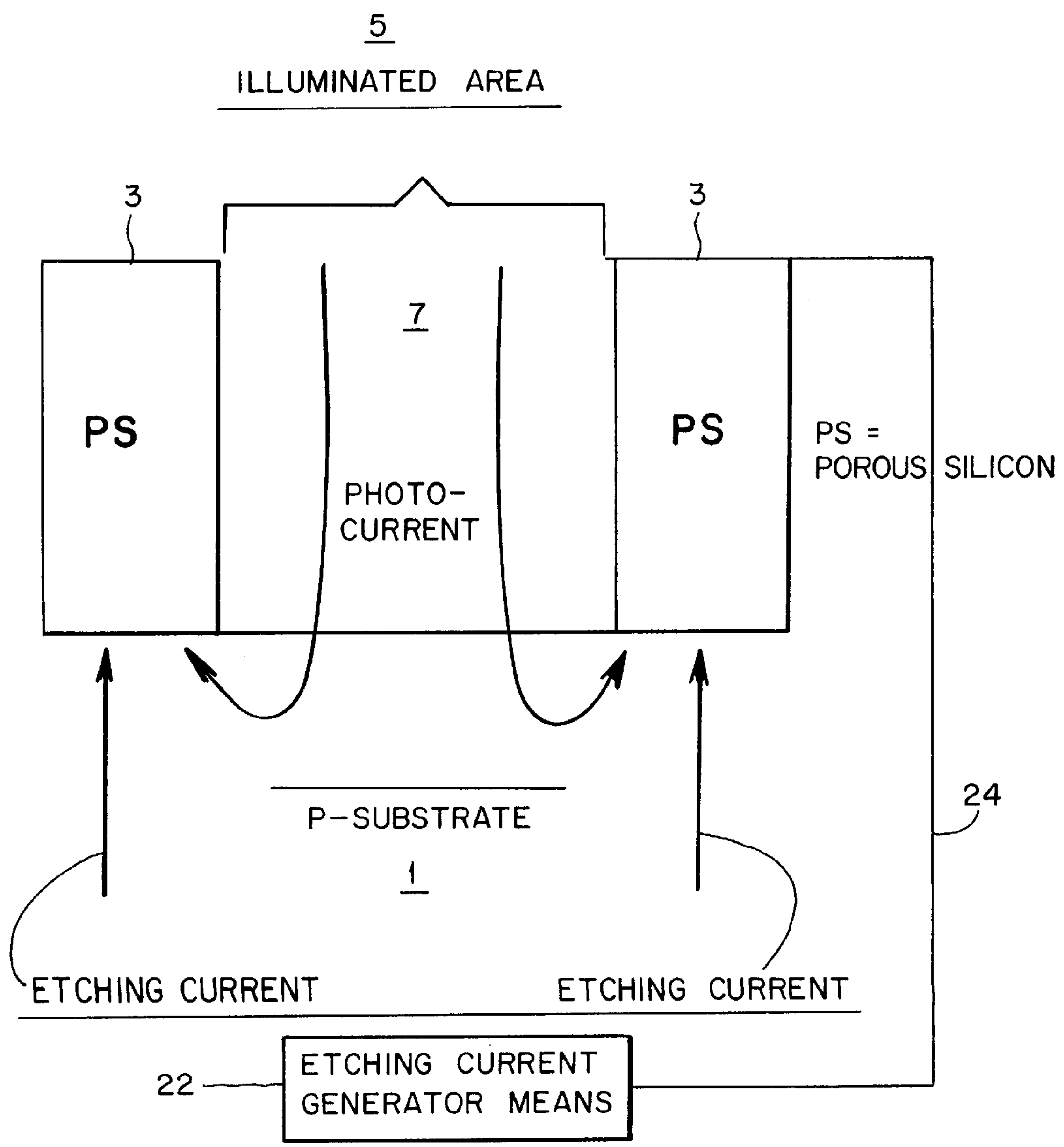
FIG. 2 shows an enlarged view of a portion of the lighting system according to FIG. 1.

The cutout of the area (7) which is not to be etched is shown in FIG. 2 in greater detail. Due to this illumination, a photocurrent flows in the selected area (7) which is not to be etched. Such photocurrent flows off into the adjacent area to be etched and structured. This photocurrent thereby readily leads to an etching process in this area even without applying an etching current, but without etching area (7). When an etching current is applied by generation means 22, this current flows through the area (3) to be etched and structured, and can be compensated by the photocurrent with suitable selection of the parameters. Etching current generator means 22 is controlled by computer 10 over lead 24.

The process for producing porous areas with the use of illumination of the specimens during and after the manufacture thereof, and the device for carrying out the process can be summarized as follows.

First, there is a suitable selection of process and apparatus parameters programmed into computer control means 10. This will enable the photocurrent to compensate the etching current by illuminating p-doped material during the course of manufacturing the porous silicon. Alternatively, the photocurrent can be higher than the etching current, so that the illuminated areas are not etched, whereas the areas not illuminated are etched, and a porous layer is produced in the areas not illuminated (FIGS. 1 and 2).

Secondly, the process and the device are as discussed above. However, the specimen is only illuminated without the application of an etching current. The photocurrent flowing off into the areas not illuminated can etch the non-illuminated areas also without an external flow of current. However, no porous layer is formed in the illuminated areas. This is also computer controlled by means 10.

Thirdly, the process is as discussed above. However, it is used for producing local areas of different porosity, or of different layer thickness, or local areas of different porosity and different layer thickness. Selective illumination is switched on or switched off by computer control means 10 during the course of the etching process. Thus, the microstructure of the porous layer can be selectively influenced in this manner. The possibility of periodic or gradual change of the illumination during or after the etching process leads to the desired structures. This is also computer controlled by means 10.

While several embodiments of the present invention have been shown and described, it is to be understood that many changes and modifications may be made thereunto without departing from the spirit and scope of the invention as defined in the appended claims.

What is claimed is:

1. Process for producing an etched and structured area of porous silicon on a substrate, comprising the steps of forming porous silicon on a p-doped substrate;

during or after said forming of the porous silicon on the substrate, directly aiming illumination at a selected area of said p-doped substrate in order to effect etching and structuring of porous silicon in another area devoid of illumination; and generating a photocurrent by illumination of a selected area, said photocurrent flowing off from the selected, illuminated area and etching a non-selected, unilluminated area.

2. Process according to claim 1, applying an etching current; and wherein the photocurrent generated is lower than said applied etching current.

3. Process according to claim 1, comprising applying an etching current for an electrochemical etching process, such etching current being compensated by the photocurrent.

4. Process according to claim 3, applying an etching current, and wherein the photocurrent generated is higher than the etching current.

5. Process according to claim 1, comprising selectively switching the illumination on or off to influence a microstructure of the porous silicon.

6. Process according to claim 5, comprising changing the illumination periodically.

7. Process according to claim 5, comprising gradually changing the illumination laterally.

8. Process according to claim 1, comprising causing the microstructure to change with respect to a property selected from the group consisting of porosity, layer thickness and both porosity and layer thickness.

9. Device for producing a structured area of porous silicon on a p-doped substrate, comprising an illuminating system for producing an etching of silicon and for forming a porous silicon;

means for selectively aiming the illuminating system directly at a selected area of a p-doped substrate in order to effect etching and structuring of porous silicon in another area devoid of illuminating; and means for controlling the illuminating system for generating a photocurrent, said photocurrent flowing off from the selected area and structuring a non-selected, unilluminated area.

10. Device according to claim 9, wherein said means for controlling adapted to cause the photocurrent to be lower than an etching current.

11. Device according to claim 9, wherein said means for controlling adapted to cause the photocurrent to compensate an etching current applied to the substrate.

12. Device according to claim 9, wherein said means for controlling adapted to cause the photocurrent to be higher than an etching current.

13. Device according to claim 9, comprising means for controlling the illuminating system for selectively switching said system on or off in order to influence a microstructure of an area of porous silicon.

14. Device according to claim 13, wherein said illuminating system has means for influencing said microstructure with respect to a property selected from the group consisting of porosity, layer thickness, and both porosity and thickness.

15. Device according to claim 13, wherein said means for controlling is adopted to change the intensity of the illuminating system periodically.

16. Device according to claim 15, wherein said means for controlling is adopted to gradually change the intensity of the illuminating system laterally.

* * * * *